US009863984B2

(12) United States Patent
Sivasubramaniam et al.

(10) Patent No.: US 9,863,984 B2
(45) Date of Patent: Jan. 9, 2018

(54) POWER MONITORING SYSTEM

(75) Inventors: Anand Sivasubramaniam, University Park, PA (US); Arunchandar Vasan, Chennai (IN); Rajesh Jayaprakash, Chennai (IN); Perumal Rajaram, Chennai (IN); Rajesh Subbiah, Chennai (IN); Praveen Orvakanti, Chennai (IN); Sivabalan Thirunavukkarasu, Chennai (IN)

(73) Assignee: Tata Consultancy Services Limited, Mumbai (IN)

( * ) Notice: Subject to any disclaimer, the term of this patent is extended or adjusted under 35 U.S.C. 154(b) by 673 days.

(21) Appl. No.: 13/637,739

(22) PCT Filed: Nov. 2, 2011

(86) PCT No.: PCT/IN2011/000754
§ 371 (c)(1),
(2), (4) Date: Oct. 31, 2013

(87) PCT Pub. No.: WO2012/098558
PCT Pub. Date: Jul. 26, 2012

(65) Prior Publication Data
US 2014/0067294 A1 Mar. 6, 2014

(30) Foreign Application Priority Data
Jan. 19, 2011 (IN) .......................... 156/MUM/2011

(51) Int. Cl.
G01R 21/133 (2006.01)
G06F 11/30 (2006.01)
H04L 12/26 (2006.01)

(52) U.S. Cl.
CPC ........ *G01R 21/133* (2013.01); *G06F 11/3006* (2013.01); *G06F 11/3062* (2013.01);
(Continued)

(58) Field of Classification Search
None
See application file for complete search history.

(56) References Cited

U.S. PATENT DOCUMENTS

2007/0078635 A1 4/2007 Rasmussen et al.
2009/0158071 A1 6/2009 Ooi et al.
(Continued)

FOREIGN PATENT DOCUMENTS

WO WO-2012/098558 A1 7/2012

OTHER PUBLICATIONS

"AVOCENT: Data Center Infrastructure Management (DCIM) White Paper", [online]. [retrieved on Nov. 9, 2011]. Retrieved from the Internet: URL:http://www.edcosurge.com/en-US/About/Events/Documents/00W-MediaKit/10_DCIM_Trellis.pdf [retrieved on Nov. 9, 2011], (Sep. 2010), 1-16.
(Continued)

*Primary Examiner* — An Do
*Assistant Examiner* — Renee I Wilson
(74) *Attorney, Agent, or Firm* — Schwegman Lundberg & Woessner, P.A.

(57) ABSTRACT

The subject matter described herein is directed to a power monitoring system for managing power in a data center. In one embodiment, the power monitoring system includes: at least one processor, a memory coupled to the at least one processor, wherein the memory includes, a computation module configured to compute at least one of peak power consumption and current power consumption of each power distribution point of a power distribution unit and an analysis module configured to identify the power distribution points which are overloaded or are underutilized based on a policy data.

10 Claims, 4 Drawing Sheets

(52) U.S. Cl.
CPC ...... *G06F 11/3065* (2013.01); *H04L 43/0817* (2013.01); *H04L 43/16* (2013.01); *Y04S 40/168* (2013.01)

(56) References Cited

U.S. PATENT DOCUMENTS

| | | | | |
|---|---|---|---|---|
| 2009/0282274 | A1* | 11/2009 | Langgood | G06F 1/3203 |
| | | | | 713/320 |
| 2010/0169690 | A1 | 7/2010 | Mundada et al. | |
| 2010/0328849 | A1 | 12/2010 | Ewing et al. | |
| 2011/0239010 | A1* | 9/2011 | Jain | G06F 1/3209 |
| | | | | 713/310 |
| 2012/0054512 | A1* | 3/2012 | Archibald | G06F 1/26 |
| | | | | 713/320 |

OTHER PUBLICATIONS

"International Application No. PCT/IN2011/000754, International Preliminary Report on Patentability dated Jul. 23, 2013", 6 pgs.
"International Application No. PCT/IN2011/000754, Written Opinion dated Jun. 1, 2012", 5 pgs.
"International Application No. PCT/IN2011/000754, International Search Report dated Jun. 1, 2012", (dated Jun. 1, 2012), 4 pgs.

* cited by examiner

POWER MONITORING SYSTEM

PRIORITY CLAIM TO RELATED APPLICATIONS

This application is a national stage application under 35 U.S.C. §371 of PCT/IN2011/000754, filed Nov. 2, 2011, and published as WO 2012/098558 A1 on Jul. 26, 2012, which claims priority to Indian Application No. 156/MUM/2011, filed Jan. 19, 2011, which applications and publication are incorporated by reference as if reproduced herein and made a part hereof in their entirety, and the benefit of priority of each of which is claimed herein.

TECHNICAL FIELD

The present subject matter, in general, relates to power monitoring, and in particular, to a system and method of power monitoring in a data centre.

BACKGROUND

Advancement in the fields of information technology (IT) and computer science has led many organizations, enterprises, etc., to make IT an integral part of their business leading to high investments in computer devices like servers, routers, switches, storage units, etc. Usually a data centre is used to house the equipments required for implementing the IT services. Conventionally, every type of organization has a method of data centre, which aims to control the main IT services, such as the Internet connectivity, intranets, local area networks (LANs), wide area networks (WAN), data storage, backups, etc. Data centers comprise IT systems that include computer devices, together with associated components like storage systems and communication systems. Further, the data centre also includes non-IT systems like redundant power supplies, uninterrupted power supply (UPS) system, safety and security devices like access control mechanisms, fire suppression devices, environmental control systems like air conditioning devices, lighting systems, etc. Due to the large number of equipments and systems housed inside a data centre, a data centre consumes a considerable amount of electrical energy.

With the growth of the organization over time the need for addition, upgradation or removal of some of IT systems or non-IT systems in the data centers arises. The addition, upgradation or removal of the IT systems or non-IT systems has to be monitored carefully so as to balance the power consumption across the various zones of the data center. Sometimes, a certain zone of the data centre may become overloaded whereas other zones may remain underutilized. Thus, it is important to plan and identify possible expansion zones in the data centre so as to optimally use the available resources.

SUMMARY

This summary is provided to introduce concepts related to power monitoring in a data centre, which is further described below in the detailed description. This summary is not intended to identify essential features of the claimed subject matter nor is it intended for use in determining or limiting the scope of the claimed subject matter. This summary is provided to introduce a selection of concepts in a simplified form In one embodiment, the power monitoring system includes: at least one processor, a memory coupled to the at least one processor, wherein the memory includes, a computation module configured to compute at least one of peak power consumption and current power consumption of each power distribution point of a power distribution unit and an analysis module configured to identify the power distribution points which are overloaded or are underutilized based on a policy data.

BRIEF DESCRIPTION OF DRAWINGS

The above and other features, aspects, and advantages of the subject matter will be better understood with regard to the following description, appended claims, and accompanying figures. In the figures, the left-most digit(s) of a reference number identifies the figure in which the reference number first appears. The use of the same reference number in different figures indicates similar or identical items.

DETAILED DESCRIPTION

Figure 1:
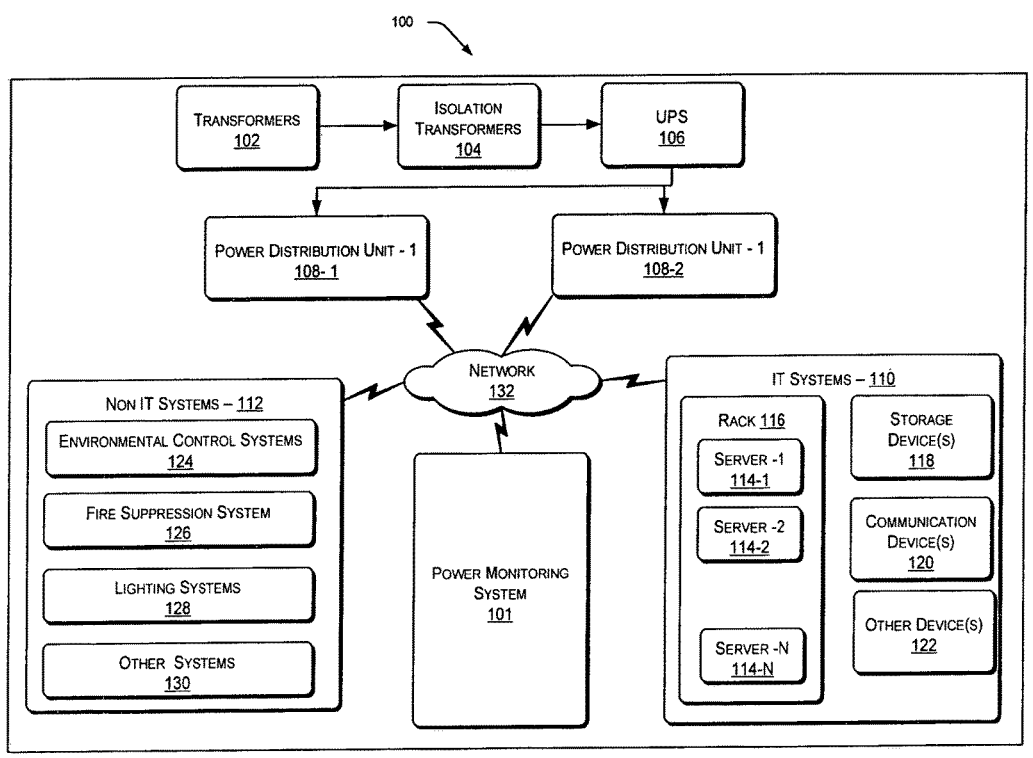
FIG. 1 illustrates an exemplary network environment implementing a power monitoring system, according to an embodiment of the present subject matter.

The present subject matter relates to a system and method(s) of power monitoring in a data centre. The system and method(s) of power monitoring monitors power consumption of IT systems, non-IT systems, etc., in real time. The power monitoring system measures the power consumed by each of the IT systems, non-IT systems, etc. Further the power consumed by each of the power distribution nodes is also measured making it easier to identify the power distribution points in the data centre which are overloaded. Additionally, the power distribution points which are under utilized and are potential zones for deployment of new IT systems, non-IT systems are also identified. The power monitoring system stores the power consumed by the IT systems, non-IT systems in a repository. Further, the power monitoring system also generates optimized power plans so as to balance the power consumption across various power distribution nodes of the data centre.

Each data center usually includes a power distribution network (PDN) which distributes the power in the various components of the data center such as IT systems, associated components, non-IT systems, etc. Conventionally, a data centre receives raw power which is fed to a transformer. The transformer steps down the received power voltage to the required power voltage of the data centre. The power is then fed to an isolation transformer. An isolation transformer is a transformer used to transfer electrical power from a source of alternating current (AC) power to some equipment or device while isolating the powered device from the power source, usually for safety. Isolation transformers usually provide galvanic isolation and are used to protect against electric shock, to suppress electrical noise in sensitive devices, or to transfer power between two circuits which should not be connected together. The output of the isolation transformer is fed to the Uninterrupted Power Supply (UPS) system. The UPS system takes care of power failures and keeps the data centre running smoothly and continuously.

The UPS further supplies power to one or more power distribution units. The power distribution units supply power to all the IT systems, non-IT systems of the data centre.

Various power distribution schemes are usually adopted by the data centre administrators to monitor and optimize the power consumption in a data centre. Conventionally, in the power distribution network, various metering units, such as energy meters, are placed at predefined locations or at power distribution points to monitor the overall power consumption in the data center. However, such metering units do not provide information related to either the individual power consumption by the different IT, non IT systems in the PDN or the power distribution across various power distribution nodes in the PDN. Moreover, the process of collecting the monitored information from the metering units in the PDN is a manual task involving substantial time and resources.

Further, conventional systems for power monitoring do not provide a comparison between the rated power requirement of a power distribution point and the actual power consumed by such a point. Thus, it becomes difficult to identify the power distribution points which are overloaded and the power distributions points which have potential expansion capabilities.

To this end, the system and the method for power monitoring is described herein. The power monitoring system, as described below, measures and monitors power consumption of the IT systems, non-IT systems, etc. in real time. For this, in one embodiment, the power consumption of each of the IT systems is monitored by metering units for each power distribution unit (PDU) and the power consumption of each of the non-IT systems is monitored by smart meters connected to such systems. The readings of the metering units and the smart meters are communicated to central monitoring stations of the power monitoring system on a real time basis. For example, the readings of the metering units and the smart meters may be refreshed at regular time intervals, say five minutes, to provide the real time power consumption of the IT systems, non-IT systems.

The power monitoring system as described herein, takes the readings and represents the data in various formats like graphs, histograms, tabular form, etc. in a dashboard for further analysis by data center administrators. The power monitoring system may also provide a hierarchical representation of the equipments or systems and also indicate the real time power consumption of each system, device, and equipment in the data center. The data of the real time power consumption can be used in various decision making procedures, like strategy for deployment of additional IT systems, non IT systems, etc., by the data center administrators to utilize the PDN more efficiently.

Additionally, the power monitoring system may include an analysis module for analyzing the data comprising details of power consumption to determine or identify potential problems and/or problem areas/zones in the data center. These problem areas/zones may include the equipments, systems or devices in the data center in which the power consumption is predicted to, cross the rated power consumption due to overloading of the PDN or where the PDN is being underutilized leading to low efficiency. In addition, the power monitoring system may indicate areas/zones where the power may need to be evenly distributed.

Further, the power monitoring system may indicate or identify areas/zones where there is a scope of adding new IT systems, non-IT systems to further increase the capacity of the data center, without overloading the power distribution network of the data center. For example, if a new server is to be added to the existing IT systems in the data center, the power monitoring system may analyze the current power consumption of the various equipments and compare the peak power consumption with the rated or approved power consumption of each equipment or system. The power monitoring system then identifies the potential power distribution point(s) where the power (peak power) is such that adding the server is feasible and such that the power distribution is balanced across the PDN and the power distribution point is not overloaded.

Thus the power monitoring system helps in the optimal use of resources of the data centre and identifies possible problem areas. Additionally, it identifies power distribution points where there is scope for expansion. Hence the power monitoring system makes the measuring and monitoring of power consumption in a data centre easy. These and other aspects are further discussed in detail in conjunction with the following figures.

FIG. 1 illustrates an exemplary data centre 100 implementing a power monitoring system 101 according to an embodiment of the present subject matter. Conventionally, the data centre 100 receives power from a sub station (not shown in figure). The power received from the substation is fed to one or more transformers 102 so as to step down the supply voltage to the required voltage of the data centre 100. The output of the transformers is fed to one or more isolation transformers 104. The isolation transformers 104 are used to transfer electrical power to an UPS 106, while isolating the UPS 106 from the direct power supply of the transformers 102, usually for safety and to suppress electrical noise for the UPS 106. One or more power distribution units (PDU) 108-1, 108-2, collectively referred to as PDUs 108, receive power from the UPS 106 and distribute the same among various IT systems 110 and non IT systems 112, etc. In case of a power failure, the UPS 106 provides backup power to the connected devices. Various devices and components, such as the UPS 106 may be conventionally known devices operated using conventionally known techniques. Description and details of such well known concepts have been omitted for simplicity of the description.

The IT systems 110 typically include one or more servers 114 arranged in one or more racks 116. Additional systems like storage device(s) 118, communication device(s) 120 like routers, hubs, network switches, etc are also categorized as IT systems 110. The IT systems 110 may also include other devices 122 for providing additional functionalities.

The non-IT systems 112 include environmental control systems 124 like air conditioners, etc., fire suppression system(s) 126 lighting system(s) 128. The non-IT systems 112 may also include other systems 130 like access control, closed circuit television (CCTVs), etc., for the proper functioning of the data centre 100.

The power monitoring system 101 monitors and measures the power consumption in the data centre 100. The power monitoring system 101 may be connected to the IT systems 110 and the non-IT systems 112 either directly or through a network 132.

The network 132 may be a wireless network, wired network or a combination thereof. The network 132 can be implemented as one of the different types of networks, such as intranet, local area network (LAN), wide area network (WAN), the internet, and such. The network 132 may either be a dedicated network or a shared network, which represents an association of the different types of networks that use a variety of protocols, for example, Hypertext Transfer Protocol (HTTP), Transmission Control Protocol/Internet Protocol (TCP/IP), User Datagram Protocol (UDP), Wireless Application Protocol (WAP), etc., to communicate with each other.

The power monitoring system 101 can be implemented as any of a variety of computing devices, including, for example, servers, a desktop personal computer, a notebook or portable computer, a workstation, a mainframe computer, a mobile computing device and an interne appliance.

The power consumption of IT systems 110 is measured by metering units (not shown) and the power consumption of the non-IT systems 112 is monitored by smart meters (not shown) connected to the non-IT systems, 112. The readings so obtained are fed into the power monitoring system 101. The power monitoring system 101 analyses the data and generates reports in various formats such as graphs, histograms, tables, etc. Additionally, the power monitoring system 101 also measures the current and peak power configuration of each power distribution point in each PDU 108. The power monitoring system 101 further indicates which power distribution points or PDUs 108 are overloaded and may be a cause of potential problem and which power distribution points or PDUs 108 are underutilized thus lowering efficiency of the data centre 100. The power monitoring system 101 further identifies the power distribution points or PDUs 108 where additional IT systems 110 or non-IT systems 112 may be deployed, thus making the load distribution even and making the data centre 100 more energy efficient.

The power monitoring system 101 may also be configured to implement any power policy in the data centre 100 to optimally use the resources. For example, in one implementation the power monitoring system 101 may automatically regenerate the power consumption data every time there is a change in any of the power distribution networks 108 due to addition or removal of IT systems 110 or non-IT systems 112 and report any potential power policy breaches and/or problems.

Figure 2:
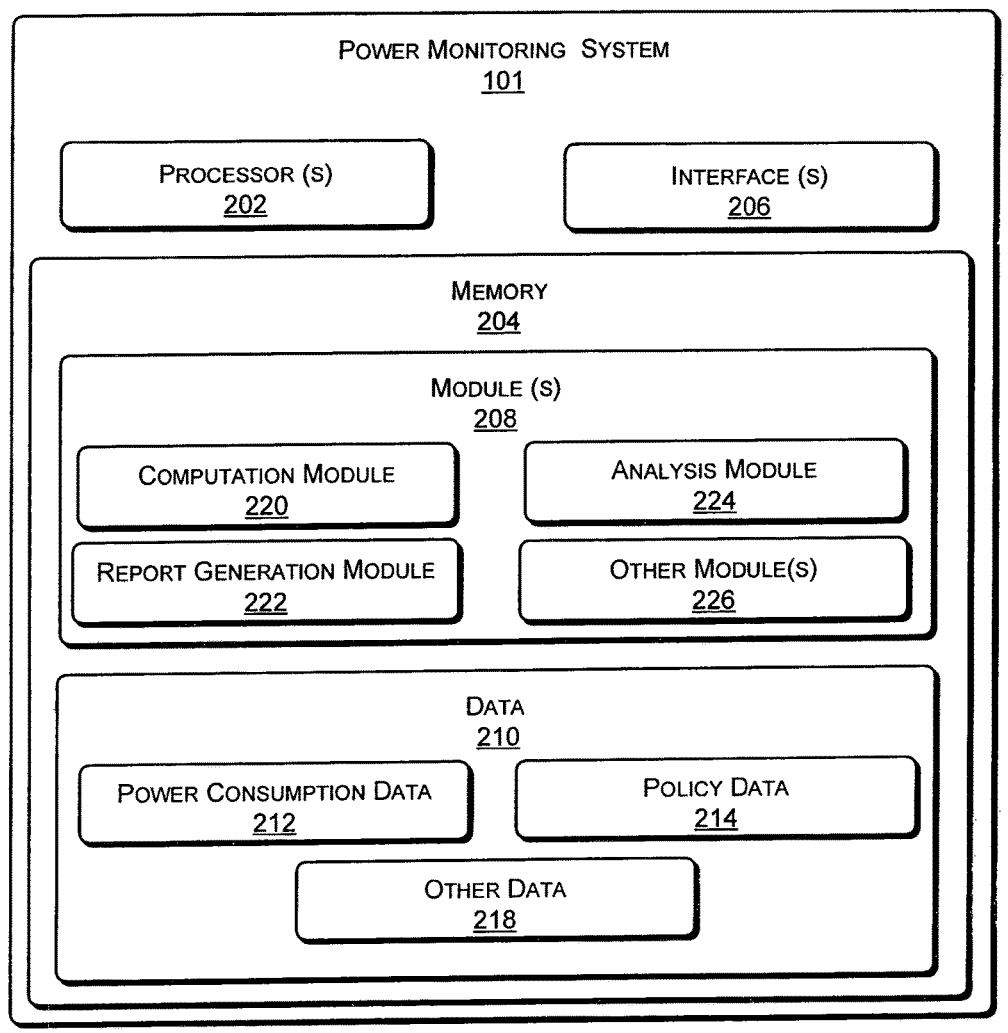
FIG. 2 illustrates the power monitoring system, according to an embodiment of the present subject matter.

FIG. 2 illustrates exemplary components of the power monitoring system 101, according to an embodiment of the present subject matter. In said embodiment, the power monitoring system 101 includes one or more processor(s) 202, a memory 204 coupled to the one or more processor(s) 202, input output interfaces 206, henceforth referred to as interfaces 206, to facilitate user interaction and communication with external network(s), peripheral(s), device(s), system(s), etc.

The processor 202 can be implemented as one or more microprocessors, microcomputers, microcontrollers, digital signal processors, central processing units, state machines, logic circuitries, or any devices that manipulate signals based on operational instructions. Among other capabilities, the processor 202 can be configured to fetch and execute computer-readable instructions and data stored in the memory 204.

The memory 204 can include any computer-readable medium known in the art including, for example, volatile memory (e.g., RAM) and/or non-volatile memory (e.g., flash, etc.). The memory 204 includes module(s) 208 and data 210. The module(s) 208 usually includes routines, programs, objects, components, data structure, etc., that perform particular task or implement particular abstract data types.

In one embodiment of the power monitoring system 101, the module(s) 208 include a computation module 220, a report generation module 222 and an analysis module 224. Further, the power monitoring system 101 may include other module(s) 226 to provide additional functionalities and utilities. The data 210 includes a power consumption data 212 and policy data 214. Further, the power monitoring system 101 may have other data 218 for performing other functions, etc.

In one implementation of the power monitoring system 101, the policy data 214 stores the power consumption policy of the data centre 100 like the maximum power allocated to each PDU 108 or power distribution point, the peak threshold power of each PDU 108 or power distribution point etc. Additionally, other parameters may also be added or modified by the data centre administrator according to the needs. In operation, the computation module 220 obtains the power consumed by each power distribution point of every PDU 108 by the IT systems 110, non-IT systems 112, etc., from the metering units and smart meter mentioned previously.

The computation module 220 computes the current and peak power consumed by each power distribution point and each PDU 108. In one implementation, the computation module 220 stores the computed current and peak power consumed by each power distribution point and each PDU 108 in the power consumption data 212.

The analysis module 224 retrieves data from the power consumption data 212 and the policy data 214 and analyses the same to identify the power distribution points or PDUs 108 which are overloaded or near the threshold limit and present a potential cause of power policy breach or problem. Additionally, the analysis module 224 also identifies the power distribution points or PDUs 108 which are underutilized and where additional load in form of IT systems 110 and/or non-IT systems 112 may be deployed.

For example, in one implementation the analysis module 224 may be configured to raise an alert for all power distribution points or PDUs 108 in which the current power consumption or the peak power is more than 95% of the allocated power, whereas all power distribution points or PDUs 108 in which the current power consumption or the peak power is less than 60% of the allocated power are identified as potential expansion zones where additional of IT systems 110 and/or non-IT systems 112 may be deployed.

The analysis module 224 may take into account various parameters to perform the analysis. For example, in one implementation the computation module 220 obtains various parameters such as the input voltage, input current, input power, output current, output voltage, output power from the metering units and the smart meters connected with the IT systems 110 and the non-IT systems 112. It should be noted that certain parameters may not be available or applicable depending on the type of IT systems 110 or non-IT systems 112. The computation module 220 further calculates the power factor which is the ratio of the real power flowing to the load to the apparent power in the circuit, and is a dimensionless number between 0 and 1 and is often expressed as a percentage.

Real power is the capacity of the circuit for performing work in a particular time. Apparent power is the product of the current and voltage of a circuit. Due to energy stored in the load and returned to the source, or due to a non-linear load that distorts the wave shape of the current drawn from the source, the apparent power will be greater than the real power. It is well known that a load with a low power factor draws more current than a load with a high power factor for the same amount of useful power transferred.

The various parameters as obtained by the computation module 220 are saved as power consumption data 212. The analysis module 224 retrieves this data from the power consumption data 212 and compares it with the corresponding values retrieved from the policy data 214. In one implementation the policy data 214 stores a high threshold and the low threshold limit for the PDUs 108 and the power distribution points. The high and low threshold limits are predefined values defined in accordance with the specification of the IT systems 110, non IT systems 112 of the data centre 100. For example, in one scenario the high threshold may be set to 90% of the rated capacity so as to set a safety margin for the operation of the data centre 100. On the other hand the low threshold may be set to a point, say 20% of the rated capacity, below which the efficiency of the PDUs 108 or the power distribution points is very low. For optimal usage the current power consumption should lie between the low and the high thresholds.

The analysis module 224 further determines the health factor of the data centre 100 which is the ratio of the number of the PDUs 108 or the power distribution points whose power consumption lies between the low and the high thresholds to the total number of PDUs 108 or power distribution points. In other implementations, the analysis module 224 may also determine other parameters like fairness indices such as Jain's fairness index to analyze the load distribution of the data centre 100.

In the said implementation the analysis module 224 also determines the threshold margin of every PDU 108 and power distribution point, which is the difference between the high threshold value and the current power consumption of each PDU 108 or power distribution point. The threshold margin is used to determine if additional IT systems 110 or non-IT systems 112 can be deployed at a particular PDU 108 or power distribution point.

The report generation module 222 obtains the analysis made by the analysis module 224 and presents the analysis in various formats like graphs, histograms, tables, etc. The report generation module 222 may also represent the power consumption of the data centre 100 in a hierarchical order. Further, in the said implementation, the report generation module 222 alerts the data centre administrator regarding PDUs 108 or power distribution points where there may be breach of power policy or which may be potential causes of power problems or which are overloaded or underutilized.

It will be appreciated that though the power monitoring system 101 has been depicted as a single system, the different modules and data 100 may be distributed over multiple computing systems located at the same place or at different geographical locations, and connected with each other through the network 132.

Figure 3:
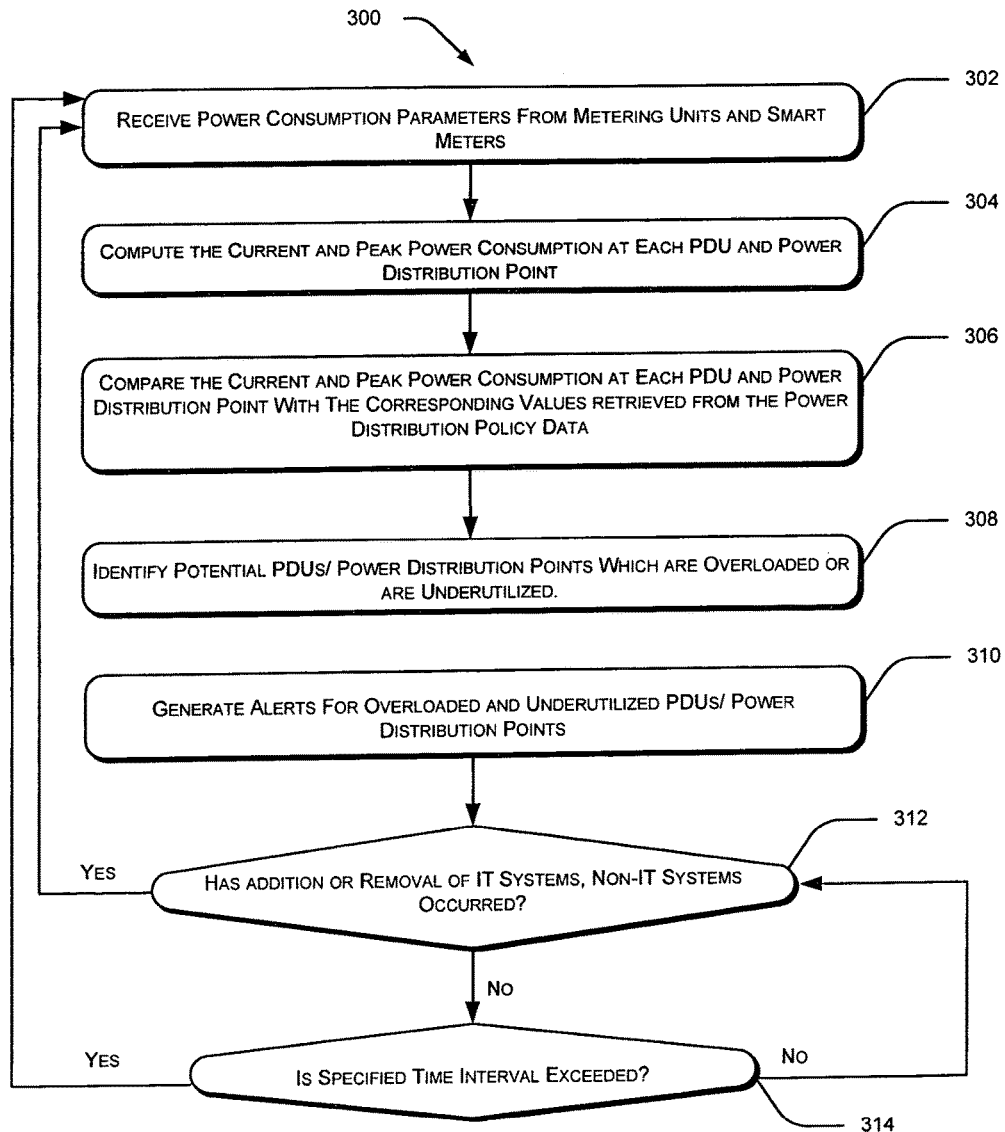
FIG. 3 illustrates an exemplary method for power monitoring in a data centre, with accordance with an embodiment of the present subject matter.

FIG. 3 illustrates an exemplary method 300 for power monitoring in a data centre, such as the aforementioned data centre 100, according to an embodiment of the present subject matter. The method 300 may be described in the general context of computer executable instructions. Generally, computer executable instructions can include routines, programs, objects, components, data structures, procedures, modules, functions, etc., that perform particular functions or implement particular abstract data types. The method 300 may also be practiced in a distributed computing environment where functions are performed by remote processing devices that are linked through a communications network. In a distributed computing environment, computer executable instructions may be located in both local and remote computer storage media, including memory storage devices.

The order in which the method 300 is described is not intended to be construed as a limitation, and any number of the described method blocks can be combined in any order to implement the method 300, or an alternative method. Additionally, individual blocks may be deleted from the method 300 without departing from the spirit and scope of the subject matter described herein. Furthermore, the method 300 can be implemented in any suitable hardware, software, firmware, or combination thereof. The method 300 is presently provided for power monitoring in the above described data centre 100. Although, the method 300 has been described in context of the data centre 100, the same should not be construed as a limitation. It will be apparent that the method 300 may be implemented for power monitoring in various other similar system and devices.

At block 302 the power consumption parameters such as the input voltage, input current, input power, the output current, the output voltage, the output power as read by the metering units and the smart meters obtained by the computation module 220. The computation module 220 further computes the current and peak power consumption of each PDU 108 and power distribution point as shown in block 304. These data are saved as the power consumption data 212.

The analysis module 224 retrieves the power distribution policy from the policy data 214. The power distribution policy may be set and/or modified by the data centre administrators according to the needs. Alternatively, the power monitoring system 101 may be configured to automatically implement any of the pre-set plans stored in the policy data based on various criteria including time, load on the IT systems 110, load on the non-IT systems 112, etc. The analysis module 224 then compares the power consumption parameters as measured by the metering units or the smart meters with the corresponding values retrieved from the policy data 214 at block 306. The retrieved value may be the corresponding rated power consumption parameter or the high and low threshold value set for the corresponding power consumption parameter.

Further, the analysis module 224 analyzes the comparison data by performing various calculations on it. For example, as mentioned previously, in one example the analysis module 224 may determine health factor of the power distribution network of the data centre 100. Additionally the analysis module 224 may also determine fairness indices like Jain's fairness index, etc. As illustrated in block 308, the analysis module 224 identifies the PDUs 108 or the power distribution points which are overloaded or are above the high threshold limit or present a potential cause of power failure and classifies the power distribution points as overloaded power distribution points. The analysis module 224 also indicates the PDUs 108 or the power distribution points which are underutilized and where additional IT systems 110, non-IT systems 112 may be deployed and classifies the power distribution points as underutilized power distribution points.

The report generation module 222 formats the analyzed data in various formats like graphs, histograms, table, etc. Further, at block 310, the report generation module 222 also generates alerts for overloaded PDU 108 which may be a potential cause of power problems. Additionally the report generation module 222 also alerts the data centre administrator for under utilized PDUs 108, which may be lowering the efficiency of the data centre 100. At block 312, the power monitoring system 101 checks for any changes in the data centre 100 like addition or removal of the IT systems 110, non-IT systems 112, etc. and repeats all the steps described in block 302 through 310, so that the data centre administrator may track the changes in real time.

In one implementation, at block 314, the power monitoring system 101 repeats the steps 302 to 310 whenever a specified time interval, say five minutes, since the last analysis is exceeded. This helps in monitoring the data centre 100 in real time and takes care of fluctuations in power, variation of power consumption of each PDU 108 and power distribution point due to variation of load on the IT systems 110, non-IT systems 112, etc. The specified time interval may be set by the data centre administrator or may be set by the power monitoring system 101 by default. Thus the power monitoring system 101 helps in monitoring the power consumption of the data centre 100 in real time.

Figure 4:
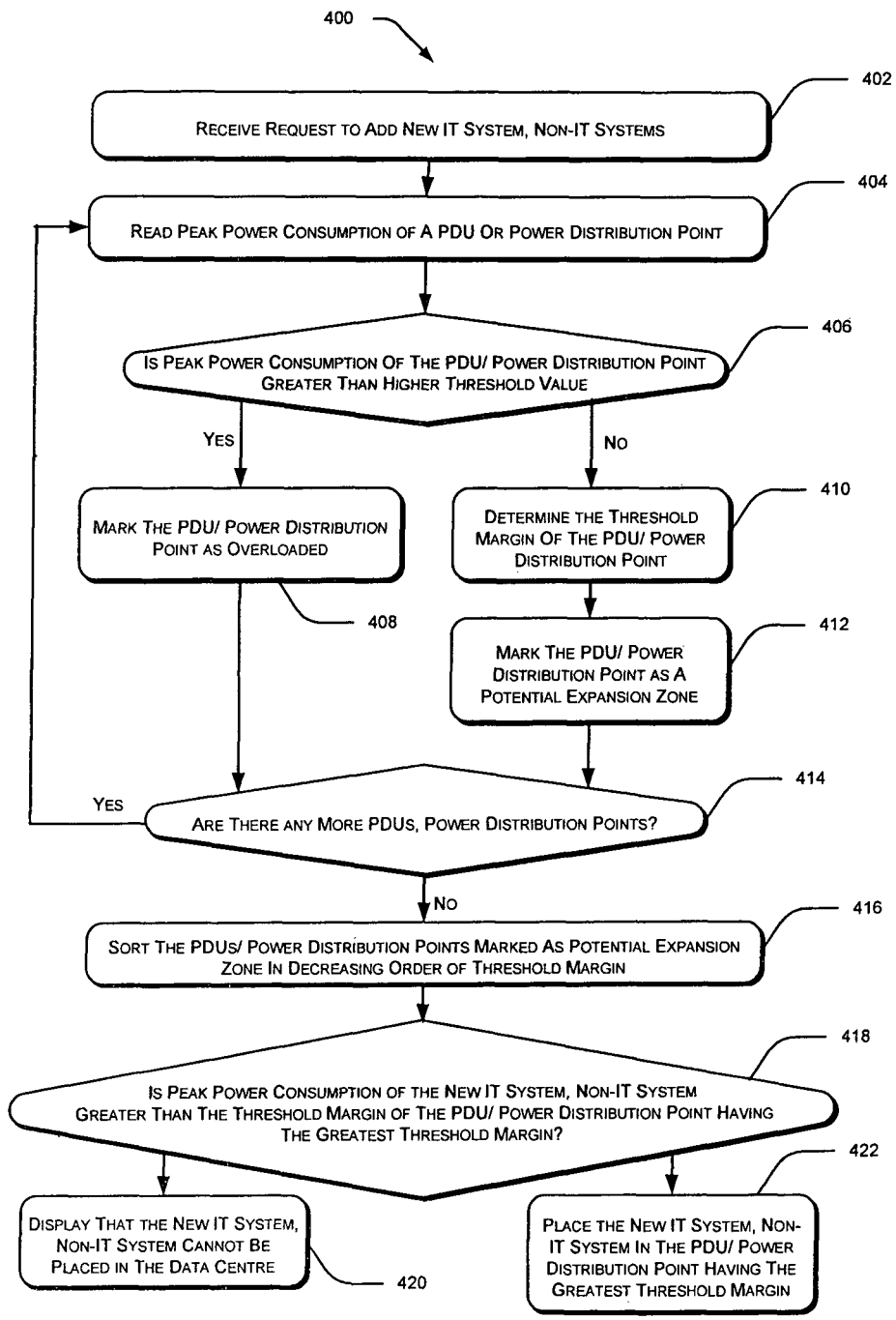
FIG. 4 illustrates an exemplary method for power distribution optimization in a data centre, according to an embodiment of the present subject matter.

FIG. 4 illustrates an exemplary method 400 for power distribution optimization in a data centre, according to an embodiment of the present subject matter. The method 400 may be described in the general context of computer executable instructions. Generally, computer executable instructions can include routines, programs, objects, components, data structures, procedures, modules, functions, etc., that perform particular functions or implement particular abstract data types. The method 400 may also be practiced in a distributed computing environment where functions are performed by remote processing devices that are linked through a communications network. In a distributed computing environment, computer executable instructions may be located in both local and remote computer storage media, including memory storage devices.

The order in which the method 400 is described is not intended to be construed as a limitation, and any number of the described method blocks can be combined in any order to implement the method 400, or an alternative method. Additionally, individual blocks may be deleted from the method 400 without departing from the spirit and scope of the subject matter described herein. Furthermore, the method 400 can be implemented in any suitable hardware, software, firmware, or combination thereof. Although, the method 400 has been described in context of the data centre 100, the same should not be construed as a limitation. It will be apparent that the method 400 may be implemented for power monitoring in various other similar system and devices.

At block 402, the power monitoring system 101 receives a request from the data centre administrator to add a new IT system and/or non-IT system. The power monitoring system 101 then reads the peak power consumption of all the available PDUs 108 or power distribution points in the power distribution network of the data centre 100 as illustrated in block 404. For each PDU 108 or power distribution point, the power monitoring system 101 determines if the peak power consumption is greater than the high threshold value as shown in block 406.

If the peak power consumption of a particular PDU 108 or power distribution point is greater than the high threshold value then the power monitoring system 101 marks or identifies the PDU 108 or power distribution point as overloaded and alerts the data centre administrator of the same as illustrated in block 408. If the peak power consumption of a particular PDU 108 or power distribution point is less than the high threshold value then the power monitoring system 101 calculates the threshold limit and determines a feasibility factor for addition of the new IT system 110 or non IT system 112 of the PDU 108 and marks or identifies the PDU 108 or power distribution point as a potential expansion zone for deployment of new IT systems 110, non-IT systems 112 as shown in blocks 410 and 412 respectively.

The power monitoring system 101 repeats the above mentioned steps so as to obtain the peak power consumption of all the available PDUs 108 or power distribution points as shown in block 414. At block 416, the power monitoring system 101 sorts the PDUs 108 or power distribution points marked as possible expansion zones are sorted in decreasing order of the threshold margin and the feasibility factor. The power monitoring system 101 now checks if the peak power consumption of the new IT system 110 or the non-IT system 112 is above the threshold margin of the PDU 108 or power distribution point having the high threshold margin as shown in block 418.

If the peak power consumption of the new IT system 110 or the non-IT system 112 is above the threshold margin of the PDU 108 or power distribution point having the high threshold margin then the power monitoring system 101 alerts the user that the new IT system 110 or non-IT system 112 cannot be deployed in the present power distribution network of the data centre, as shown in the block 420. If the peak power consumption of the new IT system 110 or the non-IT system 112 is less than the threshold margin of the PDU 108 or power distribution point having the high threshold margin then the power monitoring system 101 alerts the data centre administrator to place the new IT system 110 or the non-IT system 112 in the PDU 108 or power distribution point having the highest threshold margin, as illustrated in block 422.

Thus the power monitoring system 101 identifies the power distribution points or PDUs 108 which can be a cause of potential power problem or which are overloaded. Further, the power monitoring system 101 also identifies the power distribution points or PDUs 108 which are underutilized and are lowering the efficiency of the data centre. Additionally, the power monitoring system 101 identifies the power distribution points or PDUs 108 where additional IT systems 110 or non-IT systems 112 may be deployed. The power monitoring system 101 also presents the power consumption data to the data centre administrator in various formats such as graphs, histograms, tables, etc. Thus, the power monitoring system 101 helps the data centre administrator to monitor the data centre 100 and take decisions to optimally use the resources.

We claim:

1. A power monitoring system comprising:
   at least one processor; and
   a memory coupled to the at least one processor, wherein the memory comprises,
      a computation module configured to determine at least one of a peak power consumption and current power consumption of at least one power distribution point of a power distribution unit in a data center; and
      an analysis module configured to:
         classify the at least one power distribution point as one of an overloaded power distribution point and an underutilized power distribution point based at least, in part, on a policy data;
         generate an alert upon determination of at least one power distribution point to be one of an overloaded power distribution point and underutilized power distribution point;
         receive a request to add a new IT system and non-IT system to the power distribution point;
         compute a threshold margin for the underutilized power distribution point, wherein the threshold margin is the difference between the current power consumption of the power distribution point and the corresponding high threshold value;
         determine a potential power distribution point for addition of at least one of the new IT system and non-IT system to the data center based on a feasibility factor, wherein the feasibility factor is positive if the peak power consumption of the new IT system and non-IT system is lesser than the threshold margin of the power distribution point; and identify potential problem zones in the data center, wherein problem zones comprise equipments, devices and systems in the data center in which power is unevenly distributed due to overloaded and underutilized power distribution points.

2. The power monitoring system as claimed in claim 1, wherein the determination of the at least one of the peak power consumption and current power consumption is based on at least one of an input voltage, input current, input power, output current, output voltage and output power of at least one of IT systems and non-IT systems associated with the at least one power distribution point.

3. The power monitoring system as claimed in claim 2, further comprising one of a metering unit and smart meter to read the at least one of an input voltage, input current, input power, output current, output voltage and output power.

4. The power monitoring system as claimed in claim 1, further comprising a report generation module configured to generate reports based on power consumption of at least one of IT systems and non-IT systems associated with the at least one power distribution point.

5. The power monitoring system as claimed in claim 1, wherein the computation module is configured to store at least one of the peak power consumption and current power consumption of the at least one power distribution point unit as power consumption data.

6. The power monitoring system as claimed in claim 1 further comprising using the threshold margin to identify an equipment in the data center predicted to be a problem area zone due to over loaded or underutilized power distribution point.

7. A method for power monitoring in a data center, the method comprising:

obtaining, by a processor, at least one of a peak power consumption and current power consumption of at least one power distribution point of a power distribution unit;

comparing, by the processor, the at least one of the peak power consumption and current power consumption of the at least one power distribution point with a corresponding high threshold value retrieved from a policy data;

determining, by the processor, the at least one power distribution point to be one of an overloaded power distribution point and underutilized power distribution point;

generating, by the processor, an alert upon determination of at least one power distribution point to be one of an overloaded power distribution point and underutilized power distribution point;

upon receiving a request to add a new IT system and a non-IT system to a power distribution unit, computing, by the processor, a threshold margin for the underutilized power distribution point, wherein the threshold margin is the difference between the corresponding high threshold value and the current power consumption of each of the power distribution point;

determining, by the processor, a potential power distribution point for addition of at least one of the new IT system and non-IT system to the data center based on a feasibility factor, wherein the feasibility factor is positive if the peak power consumption of the new IT system and non-IT system is lesser than the threshold margin of the power distribution point; and identifying, by the processor, potential problem zones in the data center, wherein problem zones comprise equipments, devices and systems in the data center in which power is unevenly distributed due to overloaded and underutilized power distribution points.

8. The method for power monitoring in a data center as claimed in claim 7, wherein the determining further comprises identifying a power distribution point having a greatest threshold margin.

9. The method for power monitoring in a data center as claimed in claim 7 further comprising using the threshold margin to identify an equipment in the data center predicted to be a problem area zone due to over loaded or underutilized power distribution point.

10. A computer program product including a non-transitory computer-readable medium having embodied thereon a computer program for executing a method for power monitoring in a data center comprising:

obtaining at least one of a peak power consumption and current power consumption of at least one power distribution point of a power distribution unit;

comparing one of a current power consumption and peak power consumption of at least one power distribution point with corresponding threshold values retrieved from a policy data;

determining the at least one power distribution point to be one of an overloaded power distribution point and underutilized power distribution point;

generating, by the processor, an alert upon determination of at least one power distribution point to be one of an overloaded power distribution point and underutilized power distribution point;

upon receiving a request to add a new IT system and a non-IT system to a power distribution unit, computing, by the processor, a threshold margin for the underutilized power distribution point, wherein the threshold margin is the difference between the corresponding high threshold value and the current power consumption of each of the power distribution point;

determining, by the processor, a potential power distribution point for addition of at least one of the new IT system and non-IT system to the data center based on a feasibility factor, wherein the feasibility factor is positive if the peak power consumption of the new IT system and non-IT system is lesser than the threshold margin of the power distribution point; and identifying, by the processor, potential problem zones in the data center, wherein problem zones comprise equipments, devices and systems in the data center in which power is unevenly distributed due to overloaded and underutilized power distribution points.

* * * * *